(12) United States Patent
Kim et al.

(10) Patent No.: US 10,725,211 B2
(45) Date of Patent: Jul. 28, 2020

(54) FUNCTIONAL POLARIZING FILM AND ORGANIC LIGHT-EMITTING DISPLAY APPARATUS INCLUDING THE SAME

(71) Applicant: SAMSUNG DISPLAY CO., LTD., Yongin-si, Gyeonggi-do (KR)

(72) Inventors: Nam Jin Kim, Yongin-si (KR); Chul Hwan Park, Yongin-si (KR); Sang Woo Kim, Yongin-si (KR); Mi Kyung Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/294,384

(22) Filed: Mar. 6, 2019

(65) Prior Publication Data

US 2019/0204477 A1 Jul. 4, 2019

Related U.S. Application Data

(60) Continuation of application No. 15/825,279, filed on Nov. 29, 2017, now Pat. No. 10,234,602, which is a
(Continued)

(30) Foreign Application Priority Data

Apr. 25, 2013 (KR) .................. 10-2013-0046206

(51) Int. Cl.
*G02B 1/14* (2015.01)
*G02B 1/10* (2015.01)
(Continued)

(52) U.S. Cl.
CPC .............. *G02B 1/14* (2015.01); *G02B 1/105* (2013.01); *G02B 1/18* (2015.01); *G02B 5/3033* (2013.01); *H01L 51/524* (2013.01)

(58) Field of Classification Search
CPC . H01L 51/5256; H01L 27/32; H01L 51/5293; H01L 51/524; G02B 1/105;
(Continued)

(56) References Cited

U.S. PATENT DOCUMENTS

| 5,543,223 A | 8/1996 | Shah |
| 5,818,559 A | 10/1998 | Yoshida |

(Continued)

FOREIGN PATENT DOCUMENTS

| CN | 1646953 A | 7/2005 |
| CN | 101124494 A | 2/2008 |

(Continued)

OTHER PUBLICATIONS

Chinese Office Action issued by SIPO dated Jun. 26, 2017 in the examination of the Chinese Application No. 201410171751.X, corresponding to the present application.
(Continued)

*Primary Examiner* — Mouloucoulaye Inoussa
(74) *Attorney, Agent, or Firm* — Lewis Roca Rothgerber Christie LLP

(57) ABSTRACT

A functional polarizing film includes a polarizing layer, at least one moisture-binding layer on a first surface of the polarizing layer, and at least one moisture-blocking layer disposed on a first surface of the moisture-binding layer.

7 Claims, 8 Drawing Sheets

Related U.S. Application Data division of application No. 14/259,429, filed on Apr. 23, 2014, now Pat. No. 9,835,770.

(51) Int. Cl.
*G02B 1/18* (2015.01)
*G02B 5/30* (2006.01)
*H01L 51/52* (2006.01)

(58) Field of Classification Search
CPC ........ G02B 1/08; G02B 5/3033; G02B 5/305;
G02B 5/3016; G02F 1/133504
USPC ................. 257/40; 359/487.02, 507, 487.05,
359/487.06, 64, 96
See application file for complete search history.

(56) References Cited

U.S. PATENT DOCUMENTS

| | | | |
|---|---|---|---|
| 6,221,470 B1 | 4/2001 | Ciocca et al. | |
| 7,252,733 B2 | 8/2007 | Wang et al. | |
| 8,368,299 B2 | 2/2013 | Kim et al. | |
| 2003/0001988 A1 | 1/2003 | Maeda et al. | |
| 2003/0189264 A1 | 10/2003 | Jones et al. | |
| 2006/0057209 A1 | 3/2006 | Chapman et al. | |
| 2007/0165165 A1 | 7/2007 | Joten | |
| 2007/0211336 A1* | 9/2007 | Michihata | G02B 5/3016 |
| | | | 359/487.05 |
| 2007/0252526 A1 | 11/2007 | Aitken et al. | |
| 2010/0085508 A1 | 4/2010 | Kang et al. | |
| 2010/0221455 A1 | 9/2010 | Kim et al. | |
| 2011/0080372 A1 | 4/2011 | Lee et al. | |
| 2013/0048986 A1 | 2/2013 | Lee et al. | |
| 2013/0099658 A1* | 4/2013 | Tsai | H01L 51/0097 |
| | | | 313/504 |
| 2013/0169897 A1* | 7/2013 | Tanihara | G02F 1/13363 |
| | | | 349/15 |

FOREIGN PATENT DOCUMENTS

| | | |
|---|---|---|
| CN | 101645455 A | 2/2010 |
| CN | 101 813 801 A | 8/2010 |
| CN | 102 033 646 A | 4/2011 |
| CN | 102 417 807 A | 4/2012 |
| CN | 102 956 673 A | 3/2013 |
| CN | 103 361 027 A | 10/2013 |
| KR | 1996-0014027 B1 | 10/1996 |
| KR | 10-2002-0088052 A | 11/2002 |
| KR | 10-2010-0039663 A | 4/2010 |
| KR | 10-2010-0050470 A | 5/2010 |
| TW | 200809279 A | 2/2008 |
| WO | WO 2007/102327 A1 | 9/2007 |

OTHER PUBLICATIONS

Granted Documents and cited references issued by the Chinese Intellectual Property Office dated Jun. 19, 2018 for Chinese Patent Application No. 201410171751.X.

Office Action issued by the TIPO dated Oct. 26, 2017 in the examination of the Taiwanese Application No. 103114972.

Office Action dated Jan. 22, 2019 from corresponding KR Application 10-2013-0046206.

* cited by examiner

ND ORGANIC LIGHT-EMITTING DISPLAY APPARATUS INCLUDING THE SAME

FUNCTIONAL POLARIZING FILM AND ORGANIC LIGHT-EMITTING DISPLAY APPARATUS INCLUDING THE SAME

CROSS-REFERENCE TO RELATED PATENT APPLICATIONS

This is a continuation application based on application Ser. No. 15/825,279, filed Nov. 29, 2017, which in turn is a divisional application based on application Ser. No. 14/259,429, filed Apr. 23, 2014, now U.S. Pat. No. 9,835,770 B2, issued Dec. 5, 2017, the entire contents of both being hereby incorporated by reference.

Korean Patent Application No. 10-2013-0046206, filed on Apr. 25, 2013, in the Korean Intellectual Property Office, and entitled: "Functional Polarizing Film and Organic Light Emitting Display Apparatus Including the Same," is incorporated by reference herein in its entirety.

BACKGROUND

1. Field

Embodiments relate to a functional polarizing film and an organic light-emitting display apparatus including the same, and more particularly, to a polarizing film having a sealing function and an organic light-emitting display apparatus including the same.

2. Description of the Related Art

An organic light-emitting apparatus includes a hole injection electrode, an electron injection electrode, and an organic light-emitting device including an organic light-emitting layer formed between the hole injection electrode and the electron injection electrode. The organic light-emitting apparatus is a self light-emitting display apparatus in which light is emitted by the transition of excitors, which are generated by the combination of holes injected from the hole injection electrode and electrons injected from the electron injection electrode in the organic light-emitting layer, from an excited state to a ground state.

The organic light-emitting apparatus has received attention as an advanced display device due to the fact that it may be operated at a low voltage and may be formed in a lightweight thin shape because the organic light-emitting apparatus as a self light-emitting display apparatus does not require a separate light source. The organic light-emitting apparatus may also have high-quality characteristics, such as wide viewing angles, high contrast, and fast response speeds.

SUMMARY

According to an embodiment, there is provided a functional polarizing film including a polarizing layer, at least one moisture-binding layer disposed on one face of the polarizing layer, and at least one moisture-blocking layer disposed on one face of the moisture-binding layer.

The functional polarizing film may further include a support layer for supporting the polarizing layer.

The support layer may include triacetate cellulose (TAC).

The functional polarizing film may further include adhesive layers respectively disposed between the polarizing layer, the moisture-binding layer, and the moisture-blocking layer.

At least one of the moisture-binding layer or the moisture-blocking layer may be formed in plural.

The moisture-binding layer may include a first moisture-binding layer and a second moisture-binding layer, and the moisture-blocking layer may be disposed between the first moisture-binding layer and the second moisture-binding layer.

The moisture-binding layer may block permeation of oxygen.

The polarizing layer may be disposed between the moisture-binding layer and the moisture-blocking layer.

The polarizing layer may be formed by including a dichroic dye in polyvinyl alcohol (PVA).

The moisture-binding layer and the moisture-blocking layer may each include an organic material.

The moisture-binding layer may include at least one of PVA, an ethylene vinyl alcohol copolymer (EVOH), or poly vinylidene chloride (PVDC).

The moisture-blocking layer may include a cyclo olefin polymer (COP).

According to another embodiment, there is provided an organic light-emitting display apparatus including a display substrate, a plurality of organic light-emitting devices disposed on the display substrate, and a first functional polarizing film sealing the plurality of organic light-emitting devices, wherein the first functional polarizing film includes a polarizing layer, a first moisture-binding layer disposed on one face of the polarizing layer, and a first moisture-blocking layer disposed on one face of the first moisture-binding layer.

The organic light-emitting display apparatus may further include a sealing film disposed between the plurality of organic light-emitting devices and the first functional polarizing film.

The sealing film may be formed of an inorganic layer.

The organic light-emitting display apparatus may further include a second functional polarizing film disposed under the display substrate, wherein the second functional polarizing film includes a polarizing layer; a second moisture-binding layer disposed on one face of the polarizing layer; and a second moisture-blocking layer disposed on one face of the second moisture-binding layer.

The first functional polarizing film may further include an adhesive layer on a surface facing the display substrate.

The organic light-emitting display apparatus may further include adhesive layers respectively disposed between the polarizing layer, the first moisture-binding layer, and the first moisture-blocking layer.

At least one of the first moisture-binding layer or the first moisture-blocking layer may be formed in plural.

The polarizing layer may be disposed between the first moisture-binding layer and the first moisture-blocking layer.

The first moisture-binding layer and the first moisture-blocking layer may each include an organic material.

The first moisture-binding layer may include at least one of polyvinyl alcohol (PVA), an ethylene vinyl alcohol copolymer (EVOH), or poly vinylidene chloride (PVDC).

The first moisture-blocking layer may include a cyclo olefin polymer (COP).

The first moisture-binding layer may block permeation of oxygen.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
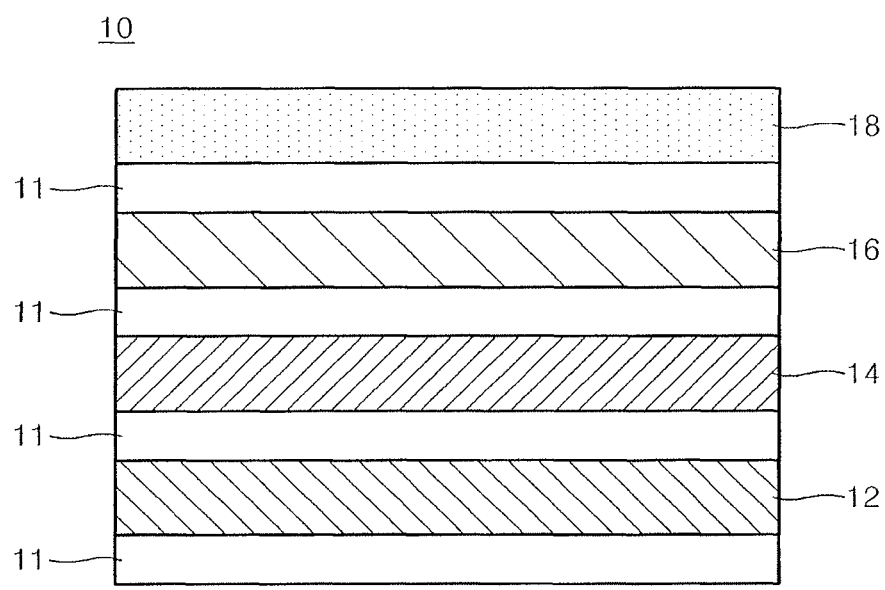
FIG. 1 illustrates a schematic cross-sectional view of a functional polarizing film according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It is also to be understood that the embodiments described herein are merely exemplary and can be embodied in various forms. For example, when a layer is referred to as being "on" another layer or substrate, it can be directly on the other layer or substrate, or intervening layers may also be present. Like reference numerals refer to like elements throughout.

The terminology used herein is for the purpose of describing particular example embodiments only and is not intended to be limiting. In the specification, the terms of a singular form may include plural forms unless referred to the contrary. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. It will be understood that although the terms "first" and "second" are used herein to describe various elements, these elements should not be limited by these terms. These terms are used only to discriminate one element from another element.

As used herein, the term "and/or" includes any and all combinations of one or more of the associated listed items. Expressions such as "at least one of," when preceding a list of elements, modify the entire list of elements and do not modify the individual elements of the list.

FIG. 1 illustrates a cross-sectional view schematically illustrating a functional polarizing film 10 according to an embodiment.

Referring to FIG. 1, the functional polarizing film 10 includes a polarizing layer 16, a moisture-binding layer 14, and a moisture-blocking layer 12. Also, the functional polarizing film 10 may further include a support layer 18 and/or at least one adhesive layer 11.

The polarizing layer 16 polarizes light incident thereon from a light source (not shown) into a light beam having a same direction as that of a polarization axis. In some embodiments, the polarizing layer 16 may be formed by including a polarizer and/or a dichroic dye in a polyvinyl alcohol (PVA) film. The dichroic dye may be iodine molecules and/or dye molecules.

For example, the polarizing layer 16 may be formed by elongating, e.g., stretching, a PVA film in one direction, and dipping the elongated PVA film in an iodine and/or dichroic dye solution. In this case, iodine molecules and/or dichroic dye molecules are arranged in parallel to a direction of drawing, i.e., the elongation direction of the PVA film. Since the iodine molecules and dye molecules exhibit dichroism, light oscillating in the direction of elongation may be absorbed by the polarizing layer 16, while light oscillating in a direction perpendicular to the elongation direction may be transmitted through the polarizing layer 16.

The moisture-binding layer 14 and/or the moisture-blocking layer 12 may be introduced in order for the functional polarizing film 10 to perform a sealing function in addition to polarizing light. In other words, the moisture-binding layer 14 and/or the moisture-blocking layer 12 may prevent or substantially minimize penetration of moisture and oxygen into the functional polarizing film 10.

In general, a polarizing film may increase color reproducibility and/or image clarity by decreasing reflection of external light from display apparatuses. The functional polarizing film 10 may block and seal internal devices of the display apparatus from external elements, e.g., oxygen and water, in addition to polarizing functions, e.g., in addition to decreasing reflection of external light.

The moisture-binding layer 14 is disposed at one side of the polarizing layer 16. The moisture-binding layer 14 may hold water by being combined with moisture ($H_2O$) penetrating from the outside. Also, the moisture-binding layer 14 may block permeation of oxygen. In some embodiments, the moisture-binding layer 14 may be formed of an organic material. In some embodiments, a material included in the moisture-binding layer 14 and water may be hydrogen bonded to each other. For example, the moisture-binding layer 14 may include at least one of PVA, poly vinylidene chloride (PVDC), and ethylene vinyl alcohol (EVOH).

The moisture-blocking layer 12 is disposed at one side of the moisture-binding layer 14, e.g., the moisture-binding layer 14 may be between the polarizing layer 16 and the moisture-blocking layer 12. The moisture-blocking layer 12 may block penetration of moisture. The moisture-blocking layer 12 may include a material, e.g., an organic material, having high hydrophobicity. As a result, the moisture-blocking layer 12 may block the penetration of moisture due to its strong repulsion of moisture. For example, the moisture-blocking layer 12 may include a cyclo olefin polymer (COP). However, the moisture-blocking layer 12 is not limited thereto, and the moisture-blocking layer 12 may be formed by including other materials having high hydrophobicity.

Since the functional polarizing film 10 according to embodiments includes both the moisture-binding layer 14 and the moisture-blocking layer 12, the moisture-binding layer 14 may hold water which is repelled by the moisture-blocking layer 12. That is, the function of blocking the penetration of water of the functional polarizing film 10 may be further strengthened by the interaction between the moisture-blocking layer 12 and the moisture-binding layer 14.

The support layer 18 may supplement the mechanical strength of the polarizing layer 16 by supporting the polarizing layer 16. Also, the support layer 18 may prevent deformation of the polarizing layer 16 according to changes in temperature or humidity. The support layer 18 may be disposed on a top surface or a bottom surface of the polarizing layer 16, or may be disposed on the top and bottom surfaces of the polarizing layer 16. The support layer 18 may be bonded with the polarizing layer 16 by the adhesive layer 11. In some embodiments, the support layer 18 may include triacetyl cellulose (TAC).

The adhesive layer 11 may be a member for bonding the polarizing layer 16, the moisture-binding layer 14, the moisture-blocking layer 12, and/or the support layer 18 to one another. Therefore, the adhesive layer 11 may be disposed between adjacent layers. The adhesive layer 11 may be formed of an optically transparent material. A lowermost adhesive layer 11 of the functional polarizing film 10 may bond the functional polarizing film 10, e.g., the moisture-blocking layer 12 of the functional polarizing film 10, and a display device, in which the functional polarizing film 10 is to be used.

Various modifications of the functional polarizing film 10 may be possible based on the above description. For example, at least one of the moisture-binding layer 14 and the moisture-blocking layer 12 may be formed in plural. Also, positions of the moisture-binding layer 14 and/or the moisture-blocking layer 12 are not limited to the ones illustrated in FIG. 1. Further, a protective layer (not shown) for protecting the functional polarizing film 10 may be further included.

FIGS. 2 through 5 illustrate cross-sectional views schematically illustrating functional polarizing films 20, 30, 40, and 50 according to other embodiments. In FIGS. 2 to 5, like reference numerals as in FIG. 1 denote like elements, and thus, repeated descriptions thereof are omitted.

Figure 2:
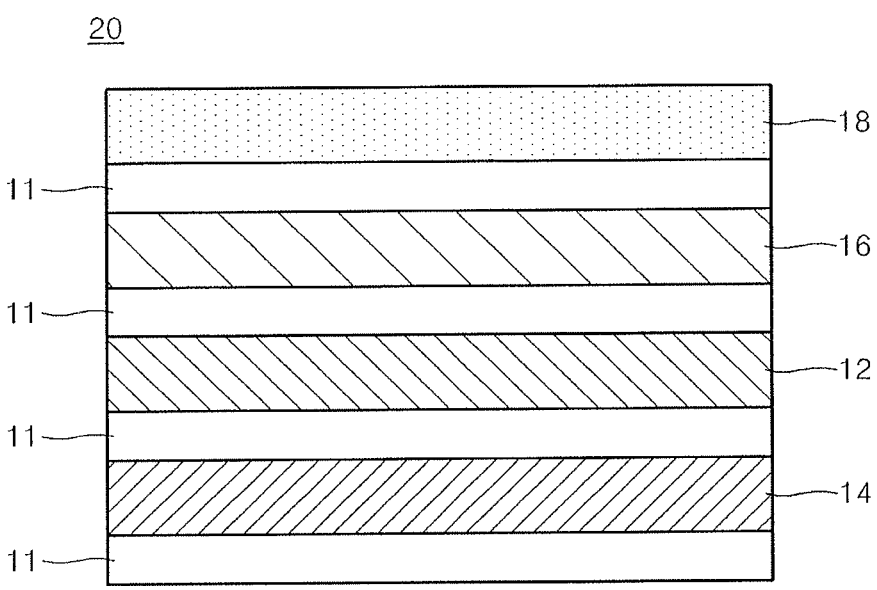
FIGS. 2 through 5 illustrate schematic cross-sectional views of functional polarizing films according to other embodiments.

Referring to FIG. 2, when the functional polarizing film 20 of FIG. 2 is compared with the functional polarizing film 10 of FIG. 1, there is a difference in that the positions of the moisture-binding layer 14 and the moisture-blocking layer 12 are switched. That is, in the functional polarizing film 10 of FIG. 1, the moisture-binding layer 14 is between the moisture-blocking layer 12 and the polarizing layer 16. In contrast, in the functional polarizing film 20 of FIG. 2, the moisture-blocking layer 12 is between the moisture-binding layer 14 and the polarizing layer 16.

Figure 3:
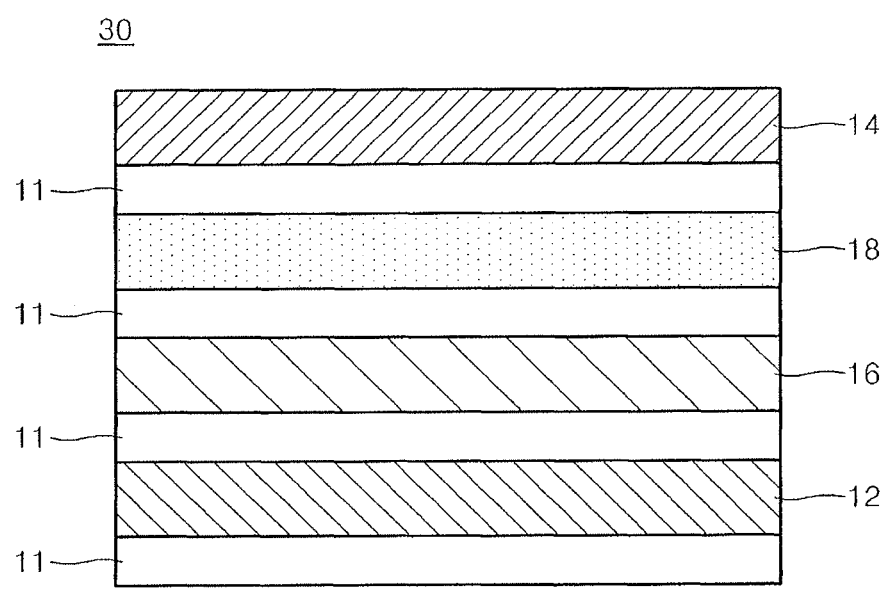

The positions of the moisture-binding layer 14 and/or the moisture-blocking layer 12 are not limited to the ones in FIGS. 1-2. Referring to FIG. 3, the moisture-binding layer 14 and the moisture-blocking layer 12 may be disposed on opposite sides of the polarizing layer 16. For example, as illustrated in FIG. 3, the moisture-binding layer 14 may be disposed on a top surface of the support layer 18, e.g., as a topmost layer of the functional polarizing film 30. Also, although not illustrated in FIG. 3, the moisture-binding layer 14 may be disposed on a top surface of the polarizing layer 16, e.g., between the support layer 18 and the polarizing layer 16. Also, the moisture-blocking layer 12 may be disposed on the top surface of the polarizing layer 16, e.g., between the support layer 18 and the polarizing layer 16, or on the top surface of the support layer 18, e.g., as a topmost layer of the functional polarizing film.

Figure 4:
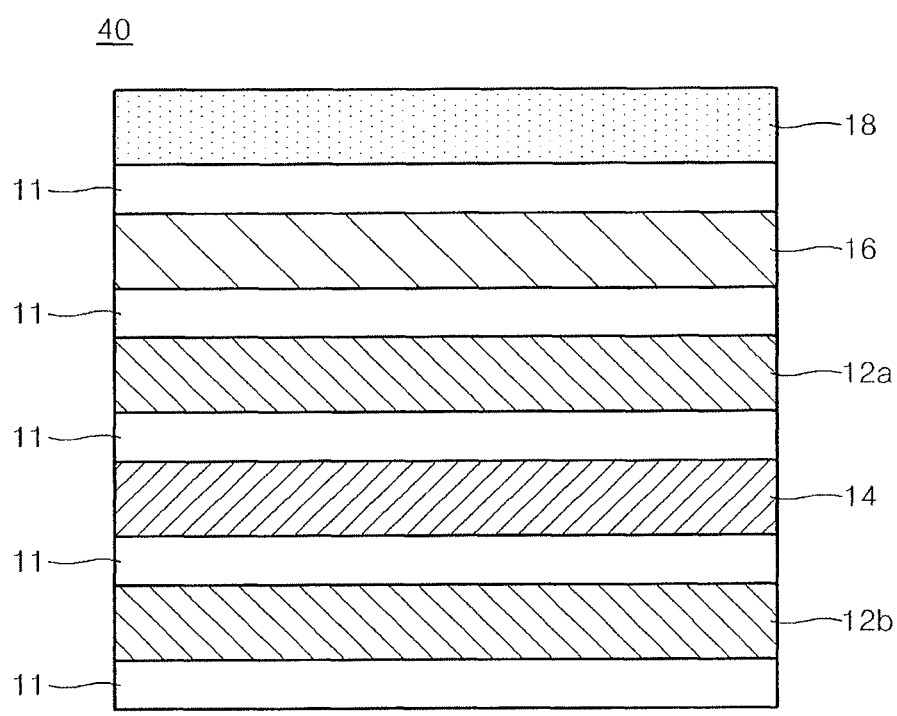
Figure 5:
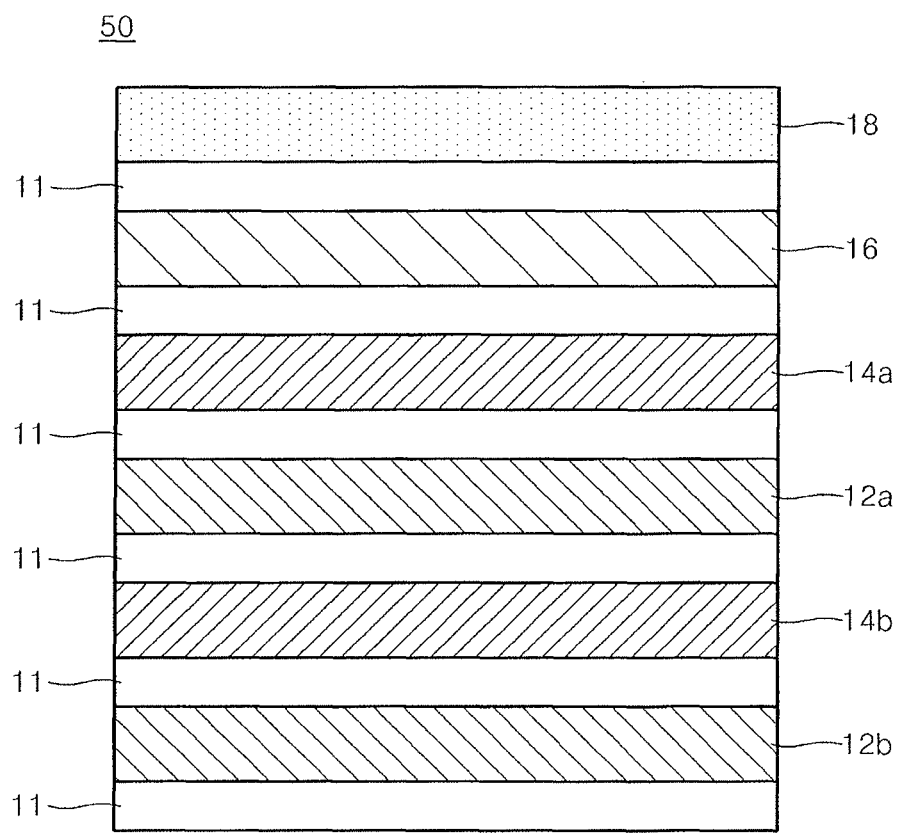

Referring to FIGS. 4 and 5, the functional polarizing films 40 and 50 are different from the functional polarizing film 10 of FIG. 1 in that the functional polarizing films 40 and 50 include a plurality of moisture-blocking layers 12a and 12b and/or a plurality of moisture-binding layers 14a and 14b.

For example, the functional polarizing film 40 of FIG. 4 may include a first moisture-blocking layer 12a and a second moisture-blocking layer 12b, and the moisture-binding layer 14 may be disposed between the first moisture-blocking layer 12a and the second moisture-blocking layer 12b. However, embodiments are not limited to the layer arrangement illustrated in FIG. 4.

In another example, the functional polarizing film 50 of FIG. 5 may include a first moisture-binding layer 14a, the first moisture-blocking layer 12a, a second moisture-binding layer 14b, and the second moisture-blocking layer 12b, which are sequentially disposed. However, embodiments are not limited to the layer arrangement illustrated in FIG. 5, e.g., the layers in FIG. 5 may be arranged in any arrangement on one or both sides of the polarizing film 16.

Thus, the function of the functional polarizing films 40 and 50 for preventing the permeation of outside elements, e.g., moisture and/or oxygen, may be improved as the moisture-blocking layers 12a and 12b and/or the moisture-binding layers 14a and 14b are formed in plural.

Figure 6:
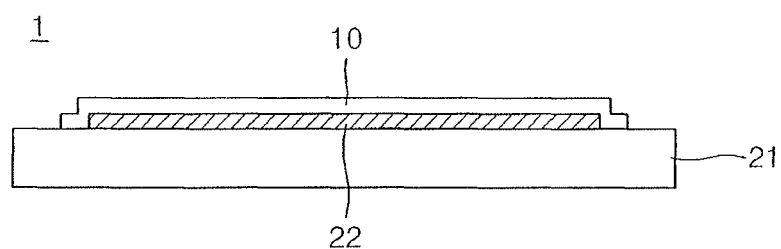
FIG. 6 illustrates a schematic cross-sectional view of an organic light-emitting display apparatus including a functional polarizing film, according to an embodiment.

FIG. 6 illustrates a cross-sectional view schematically illustrating an organic light-emitting display apparatus 1 including the functional polarizing film 10, according to an embodiment. In FIG. 6, though the organic light-emitting display apparatus 1 including the functional polarizing film 10 of FIG. 1 is illustrated, either one of the functional polarizing films 20, 30, 40, and 50 of FIGS. 2 to 5 may be used.

Referring to FIG. 6, the organic light-emitting display apparatus 1 may include a display substrate 21, an organic light-emitting part 22, and the functional polarizing film 10 for sealing the organic light-emitting part 22. The functional polarizing film 10 seal, e.g., completely seals, the organic light-emitting part 22.

The display substrate 21 may be a glass substrate. However, the display substrate 21 is not limited thereto, and the display substrate 21 may be a substrate formed of metal or plastic. The display substrate 21 may be a flexible substrate that may be bent.

The organic light-emitting part 22 is disposed on one surface of the display substrate 21, and may generate an image. The organic light-emitting part 22 may include a plurality of organic light-emitting devices (OLEDs), as will be described in more detail below.

Since the functional polarizing film 10 of the organic light-emitting display apparatus 1 includes the polarizing layer 16 (see FIG. 1), image clarity and color reproducibility of the organic light-emitting display apparatus 1 is improved. Also, since the functional polarizing film 10 includes both the moisture-binding layer 14 and the moisture-blocking layer 12, the functional polarizing film 10 prevents or substantially minimizes oxygen and water from penetrating into the organic light-emitting part 22. That is, the functional polarizing film 10 may seal the organic light-emitting part 22.

The lowermost adhesive layer 11 (see FIG. 1) is prepared as a surface of the functional polarizing film 10 facing the display substrate 21, i.e., a surface of the functional polarizing film 10 contacting the organic light-emitting part 22. Thus, the functional polarizing film 10 and the organic light-emitting part 22 may be tightly bonded to each other via the adhesive layer 11.

Figure 7:
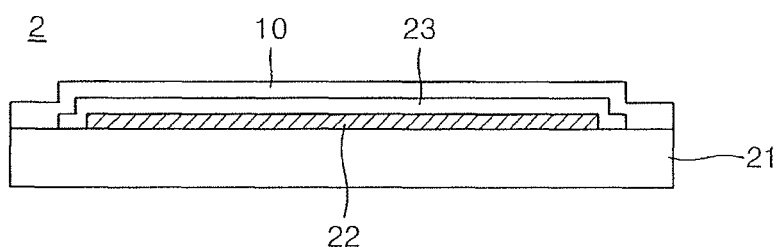
FIG. 7 illustrates a schematic cross-sectional view of an organic light-emitting display apparatus including a functional polarizing film, according to another embodiment.

FIG. 7 illustrates a cross-sectional view schematically illustrating an organic light-emitting display apparatus 2 including the functional polarizing film 10, according to another embodiment. In FIG. 7, though the organic light-emitting display apparatus 2 including the functional polarizing film 10 of FIG. 1 is illustrated, either one of the functional polarizing films 20, 30, 40, and 50 of FIGS. 2 to 5 may be used.

Referring to FIG. 7, the organic light-emitting display apparatus 2 may include the display substrate 21, the organic light-emitting part 22, the functional polarizing film 10, and a sealing film 23. In FIG. 7, like reference numerals as in FIG. 6 denote like members, and thus, repeated descriptions thereof are omitted.

The sealing film 23 is disposed between the organic light-emitting part 22 and the functional polarizing film 10, and seals the organic light-emitting part 22. Since the sealing film 23 is applied to the organic light-emitting display apparatus 2, the function of preventing the permeation of outside air into the organic light-emitting part 22 may be improved, in addition to the sealing by the functional polarizing film 10.

The sealing film 23 may have a structure in which an inorganic layer formed of an inorganic material, e.g., silicon oxide and/or silicon nitride, and an organic layer formed of an organic material, e.g., epoxy and/or polyimide, are alternatingly stacked. The inorganic layer or the organic layer may be each formed in plural.

For example, the organic layer is formed of a polymer and may be a single layer or multilayers formed of any one of polyethylene terephthalate, polyimide, polycarbonate, epoxy, polyethylene, and polyacrylate. For example, the organic layer may be formed of polyacrylate, e.g., may include a polymerized monomer composition including a diacrylate-based monomer and a triacrylate-based monomer. A monoacrylate-based monomer may be further included in the monomer composition. Also, a known photoinitiator, e.g., 2,4,6-trimethylbenzoyl diphenyl phosphine oxide (TPO), may be further included in the monomer composition. However, embodiments are not limited thereto.

The inorganic layer may be a single layer or multilayers including metal oxide or metal nitride. For example, the inorganic layer may include at least one of $SiN_x$, $Al_2O_3$, $SiO_2$, and $TiO_2$.

An uppermost layer in the sealing film 23, i.e., a layer of the sealing film 23 exposed to the outside, may be an inorganic layer so as to prevent the penetration of moisture into the organic light-emitting device. For example, the sealing film 23 may include at least one sandwich structure, in which at least one organic layer is inserted between at least two inorganic layers. Also, the sealing film 23 may include at least one sandwich structure, in which at least one inorganic layer is inserted between at least two organic layers.

Figure 10:
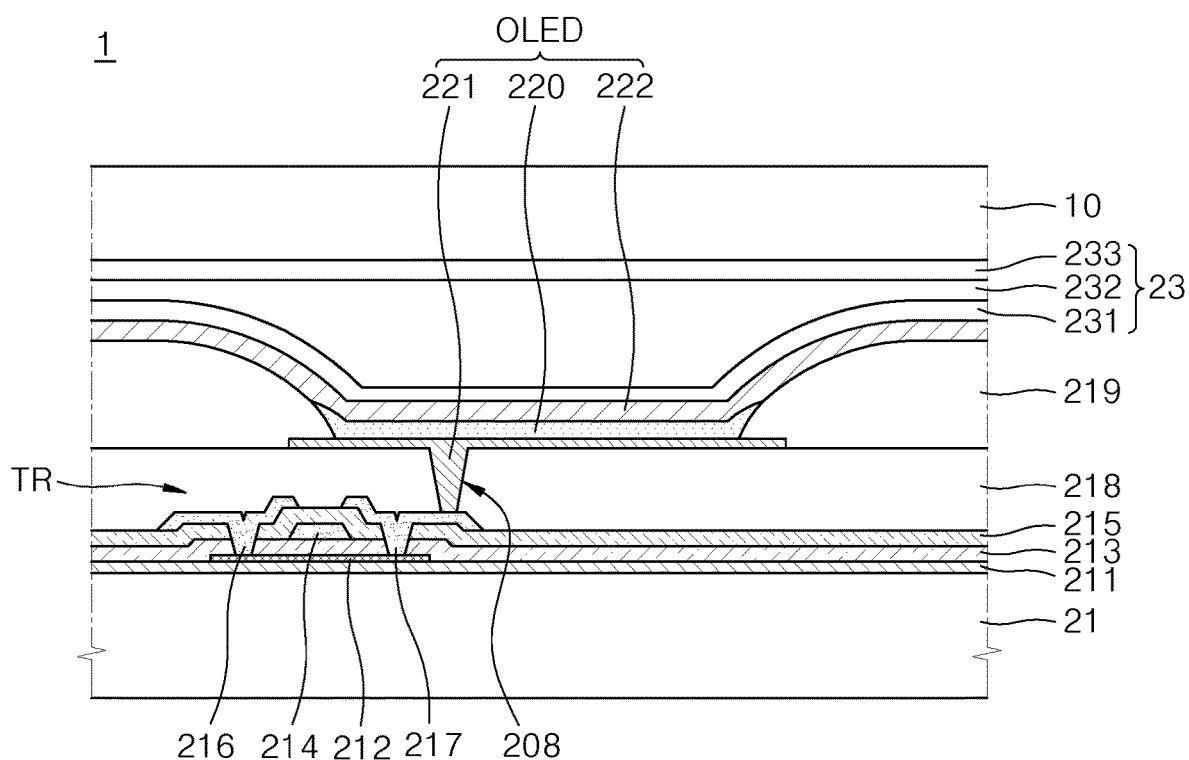
FIG. 10 illustrates an enlarged cross-sectional view of an organic light emitting part of the organic light-emitting display apparatus according to an embodiment.

Referring to FIG. 7 and FIG. 10, the sealing film 23 may sequentially include a first inorganic layer 231, a first organic layer 232, and a second inorganic layer 233 above the organic light-emitting part 22. Also, the sealing film 23 may sequentially include a first inorganic layer, a first organic layer, a second inorganic layer, a second organic layer, and a third inorganic layer above the organic light emitting part 22. Also, the sealing film 23 may sequentially include a first inorganic layer, a first organic layer, a second inorganic layer, a second organic layer, a third inorganic layer, a third organic layer, and a fourth inorganic layer above the organic light-emitting part 22.

A halogenated metal layer including LiF may be further included between the organic light-emitting part 22 and the first inorganic layer of the sealing film 23. The halogenated metal layer may prevent damage to the organic light-emitting part 22 when the first inorganic layer is formed by sputtering or plasma deposition.

The first organic layer of the sealing film 23 may have an area smaller than that of the second inorganic layer, and the second organic layer may also have an area smaller than that of the third inorganic layer. Also, the first organic layer is completely covered, e.g., sealed, by the second inorganic layer, and the second organic layer may also be completely covered, e.g., sealed, by the third inorganic layer.

As another example, the sealing film 23 may have a layer structure including low-melting glass, e.g., tin oxide (SnO). However, embodiment ns are not limited thereto.

As described above, the sealing film 23 may have various configurations. However, while the sealing film 23 was described as including multiple layers, the sealing film 23 may also be formed of a single inorganic layer for process simplicity and cost reduction.

Figure 8:
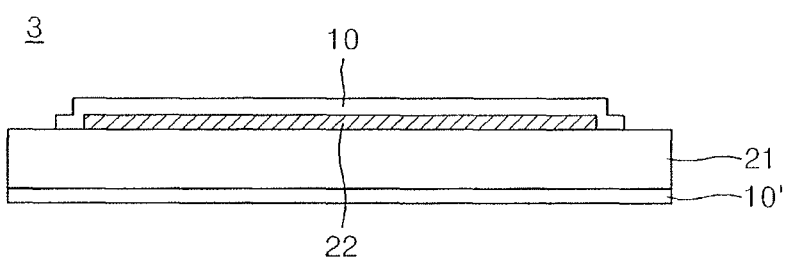
FIG. 8 illustrates a schematic cross-sectional view of an organic light-emitting display apparatus including functional polarizing films, according to yet another embodiment.

FIG. 8 illustrates a cross-sectional view schematically illustrating an organic light-emitting display apparatus 3 according to another embodiment. In FIG. 8, though the organic light-emitting display apparatus 3 including the functional polarizing film 10 of FIG. 1 is illustrated, either one of the functional polarizing films 20, 30, 40, and 50 of FIGS. 2 to 5 may be used.

Referring to FIG. 8, the organic light-emitting display apparatus 3 may include multiple functional polarizing films. That is, the organic light-emitting display apparatus 3 may include the display substrate 21, the organic light-emitting part 22, the functional polarizing film 10 sealing the organic light-emitting part 22, and a functional polarizing film 10' disposed under the display substrate 21. In FIG. 8, like reference numerals as in FIG. 6 denote like members, and thus, repeated descriptions thereof are omitted.

The functional polarizing film 10' is disposed under the display substrate 21 and thus, may prevent outside air from penetrating into the organic light-emitting part 22 through the display substrate 21. Also, in a case where the organic light-emitting display apparatus 3 is a bottom-emission type, in which light is emitted from a bottom surface of the display substrate 21, the functional polarizing film 10' may be used for image clarity and color reproducibility.

Either one of the functional polarizing films 10, 20, 30, 40, and 50 of FIGS. 1 to 5 may be used as the functional polarizing film 10'. Also, various modifications may be possible based on the functional polarizing films 10, 20, 30, 40, and 50.

Figure 9:
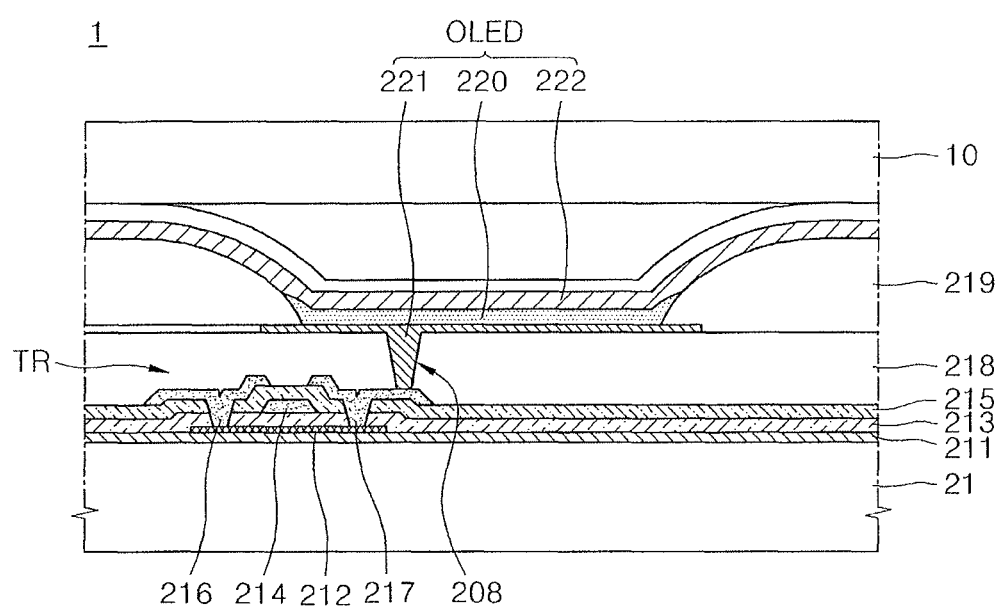
FIG. 9 illustrates an enlarged cross-sectional view of an organic light-emitting part of the organic light-emitting display apparatus in FIG. 6.

FIG. 9 illustrates an enlarged cross-sectional view of the organic light-emitting part 22 of the organic light-emitting display apparatus 1 illustrated in FIG. 6.

Referring to FIG. 9, the organic light-emitting display apparatus 1 may include the display substrate 21, the polarizing film 10, a buffer layer 211, a thin film transistor (TR), an OLED, and a pixel-defining layer 219. In FIG. 9, like reference numerals as in FIG. 6 denote like members, and thus, repeated descriptions thereof are omitted.

The buffer layer 211 may prevent diffusion of impurity ions into a top surface of the display substrate 21, may prevent penetration of moisture or outside air, and may planarize the surface of the display substrate 21. In some embodiments, the buffer layer 211 may be formed of an inorganic material, e.g., silicon oxide, silicon nitride, silicon oxynitride, aluminum oxide, aluminum nitride, titanium oxide, and titanium nitride, an organic material, e.g., polyimide, polyester, and acryl, or a stack thereof. The buffer layer 211 may be omitted if necessary.

The TR may include an active layer 212, a gate electrode 214, and source and drain electrodes 216 and 217. A gate dielectric layer 213 may be disposed between the gate electrode 214 and the active layer 212 to insulate therebetween.

The active layer 212 may be prepared on the buffer layer 212. An inorganic semiconductor, e.g., amorphous silicon or polysilicon, or an organic semiconductor may be used as the active layer 212. In some embodiments, the active layer 212 may be formed of an oxide semiconductor. For example, the oxide semiconductor may include an oxide of a metal element of Group 12, 13, or 14, e.g., zinc (Zn), indium (In), gallium (Ga), tin (Sn), cadmium (Cd), germanium (Ge), and/or hafnium (Hf).

The gate dielectric layer 213 may be prepared on the buffer layer 211 to cover the active layer 212, and the gate electrode 214 may be formed on the gate dielectric layer 213. An interlayer dielectric 215 may be formed on the gate dielectric layer 213 to cover the gate electrode 214, and the source electrode 216 and the drain electrode 217 may be formed on the interlayer dielectric 215 to respectively contact the active layer 212 through contact holes.

The above-described structure of the TR is not necessarily limited thereto, and TRs having various structures may be used. For example, the TR in FIG. 9 is formed to have a top gate structure, but may be formed to have a bottom gate structure, in which the gate electrode 24 is disposed under the active layer 212.

A pixel circuit (not shown), including a capacitor as well as the TR, may be formed. A planarization layer 218 for covering the pixel circuit including the TR may be prepared on the interlayer dielectric 215. The planarization layer 218 may remove a step height and planarize so as to improve the luminous efficiency of the OLED prepared thereon.

The planarization layer 218 may be formed of an inorganic material and/or an organic material. For example, the planarization layer 218 may include a photoresist, an acryl-based polymer, a polyimide-based polymer, a polyamide-based polymer, a siloxane-based polymer, a polymer including a photosensitive acrylic carboxylic group, novolac resin, alkali-soluble resin, silicon oxide, silicon nitride, silicon oxynitride, silicon oxycarbide, silicon carbonitride, aluminum, magnesium, zinc, hafnium, zirconium, titanium, tantalum, aluminum oxide, titanium oxide, tantalum oxide, magnesium oxide, zinc oxide, hafnium oxide, zirconium oxide, and titanium oxide.

The OLED may be disposed on the planarization layer 218. The OLED may include a first electrode 221, an organic light-emitting layer 220, and a second electrode 222. The pixel-defining layer 219 may be disposed on the planarization layer 218 and the first electrode 221, and may define a pixel region and a non-pixel region.

The organic light-emitting layer 220 may be formed using a low molecular weight or polymer organic material. In a case where the low molecular weight organic material is used, a hole injection layer (HIL), a hole transport layer (HTL), an emission layer (EML), an electron transport layer (ETL), and an electron injection layer (EIL) may be formed by being stacked in a single or composite structure. The above low molecular weight organic material may be formed by vacuum deposition. The EML may be independently formed for each red (R), green (G), and blue (B) pixel, and the HIL, HTL, ETL, and EIL may be commonly applied to the R, G, and B pixels as common layers.

In a case where the organic light-emitting layer 220 is formed of a polymer organic material, only the HTL may be included, centered on the EML, in a direction of the first electrode 221. The HTL may be formed on the first electrode 221 by inkjet printing or spin coating using poly-(2,4)-ethylene-dihydroxy thiophene (PEDOT) or polyaniline (PANI). A polymer organic material, e.g., polyphenylene vinylene (PPV) and polyfluorene, may be used as an organic material usable in the above case, and a color pattern may be formed using a common method, e.g., inkjet printing, spin coating, or thermal transfer using a laser beam.

The HIL may be formed of a phthalocyanine compound, such as copper phthalocyanine, or starburst-type amines such as TCTA or m-MTDATA, and m-MTDAPB.

The HTL may be formed of, e.g., N,N'-bis(3-methylphenyl)-N,N'-diphenyl-[1,1-biphenyl]-4,4'-diamine (TPD) and N,N'-di(naphthalene-1-yl)-N,N'-diphenyl benzidine (α-NPD). The EIL may be formed of, e.g., LiF, NaCl, CsF, Li$_2$O, BaO, and lithium quinolate (Liq). The ETL may be formed of, e.g., Alga.

The EML may include a host material and a dopant material. Examples of the host material may include tris(8-hydroxy-quinolinato)aluminum (Alq$_3$), 9,10-di(naphth-2-yl)anthracene (AND), 3-tert-butyl-9,10-di(naphth-2-yl)anthracene (TBADN), 4,4'-bis(2,2-diphenyl-ethene-1-yl)-4,4'-dimethylphenyl (DPVBi), 4,4'-bis(2,2-diphenyl-ethene-1-yl)-4,4'-dimethylphenyl (p-DMDPVBi), tert(9,9-diarylfluorene)s (TDAF), 2-(9,9'-spirobifluorene-2-yl)-9,9'-spirobifluorene (BSDF), 2,7-bis(9,9'-spirobifluorene-2-yl)-9,9'-spirobifluorene (TSDF), bis(9,9-diarylfluorene)s (BDAF), 4,4'-bis(2,2-diphenyl-ethene-1-yl)-4,4'-di-(tert-butyl)phenyl (p-TDPVBi), 1,3-bis(carbazol-9-yl)benzene (mCP), 1,3,5-tris(carbazol-9-yl)benzene (tCP), 4,4',4"-tris(carbazol-9-yl)triphenylamine (TcTa), 4,4'-bis(carbazol-9-yl)biphenyl (CBP), 4,4'-bis(9-carbazolyl)-2,2'-dimethyl-biphenyl (CBDP), 4,4'-bis(carbazol-9-yl)-9,9-dimethyl-fluorene (DMFL-CBP), 4,4'-bis(carbazol-9-yl)-9,9-bis(9-phenyl-9H-carbazol)fluorene (FL-4CBP), 4,4'-bis(carbazol-9-yl)-9,9-di-tolyl-fluorene (DPFL-CBP), and 9,9-bis(9-phenyl-9H-carbazol)fluorene (FL-2CBP). Examples of a dopant material may include 4,4'-bis [4-(di-p-tolylamino) styryl] biphenyl (DPAVBi), AND, and TBADN.

The first electrode 221 may be disposed on the planarization layer 218 and may be electrically connected to the drain electrode 217 of the TR through a through hole 208 penetrating through the planarization layer 218. The first electrode 221 may function as an anode, and the second electrode 222 may function as a cathode. However, embodiments are not limited thereto, and polarities of the first electrode 221 and the second electrode 222 may be reversed.

In a case where the first electrode 221 functions as an anode, the first electrode 221 may be formed of a material having a high work function, e.g., indium tin oxide (ITO), indium zinc oxide (IZO), ZnO, or In$_2$O$_3$. In a case where the organic light-emitting display apparatus 1 is a top-emission type, in which an image is generated in a direction opposite to the display substrate 1, the first electrode 221 may further include a reflection layer including, e.g., silver (Ag), magnesium (Mg), aluminum (Al), platinum (Pt), palladium (Pd), gold (Au), nickel (Ni), neodymium (Nd), iridium (Ir), chromium (Cr), lithium (Li), ytterbium (Yb), or calcium (Ca). The above metals may be used alone or in combination thereof. Also, the first electrode 221 may be formed in a single layer structure or a multilayer structure including the above-described metal and/or alloy. In some embodiments, the first electrode 221 as a reflective electrode may include an ITO/Ag/ITO structure.

In a case where the second electrode 222 functions as a cathode, the second electrode 222 may be formed of a metal, e.g., Ag, Mg, Al, Pt, Pd, Au, Ni, Nd, Ir, Cr, Li, or Ca. In the case where the organic light-emitting display apparatus 1 is a top-emission type, the second electrode 222 may be light transmissible. In some embodiments, the second electrode 222 may be formed by including a transparent conductive metal oxide, e.g., ITO, IZO, zinc tin oxide (ZTO), ZnO, or $In_2O_3$.

In another embodiment, the second electrode 222 may be formed of a thin film including at least one of, e.g., Li, Ca, LiF/Ca, LiF/Al, Al, Ag, Mg, or Yb. For example, the second electrode 222 may be formed to have a single layer structure or a multilayer structure of Mg:Ag, Ag:Yb, and/or Ag. Different from the first electrode 221, the second electrode 222 may be formed to allow a common voltage to be applied to all pixels.

The pixel-defining layer 219 has a plurality of openings exposing the first electrode 221 and defines the pixel region and non-pixel region of the OLED. The organic light-emitting layer 220 may emit light as the first electrode 221, the organic light-emitting layer 220, and the second electrode 222 are sequentially stacked in the opening of the pixel-defining layer 219. That is, a region having the pixel-defining layer 219 formed therein substantially becomes the non-pixel region, and the opening of the pixel-defining layer 219 substantially becomes the pixel region.

As described above, since the OLED includes the first electrode 221, the second electrode 222, and the organic light-emitting layer 220 formed of an organic material, characteristics of the OLED may be potentially degraded due to moisture or oxygen. However, since the functional polarizing film 10 according to embodiments has a sealing function, in addition to a polarizing function, the functional polarizing film 10 may prevent the degradation of the characteristics of the OLED by preventing the penetration of moisture and oxygen.

Also, since the functional polarizing film 10 seals the organic light-emitting part 22 without using a separate sealing structure, a thickness of the organic light-emitting display apparatus 1 may be decreased. Further, the manufacturing process may be simplified and costs may be reduced.

By way of summary and review, an organic light-emitting device, e.g., an organic light emitting diode (OLED), is very vulnerable to an external environment, e.g., oxygen and water, and requires a sealing structure. However, a conventional sealing structure of an organic light-emitting device may require numerous processes, which increase costs and manufacturing complexity. Further, the conventional sealing structure may increase an overall thickness of the organic light-emitting display apparatus.

In contrast, the functional polarizing film according to embodiments includes a moisture-binding layer and a moisture-blocking layer, in addition to a polarizing film, so penetration of moisture and/or oxygen may be prevented. Also, since the functional polarizing film may seal an organic light-emitting part in an organic light-emitting display apparatus, a separate sealing structure may be omitted, thereby decreasing an overall thickness of the organic light-emitting display apparatus, simplifying the manufacturing process, and reducing manufacturing costs.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light-emitting display apparatus comprising:
    a display substrate;
    an organic light-emitting device on the display substrate;
    a sealing film sealing the organic light-emitting device; and
    a polarizing film on the sealing film,
    wherein the polarizing film includes:
    a first adhesive layer,
    a first moisture-blocking layer,
    a second adhesive layer,
    a second moisture-blocking layer,
    a polarizing layer, and
    a support layer on the polarizing layer,
    wherein the first adhesive layer is between the sealing film and the first moisture blocking layer,
    the first adhesive layer, the first moisture-blocking layer, the second adhesive layer, the second moisture-blocking layer, and the polarizing layer are sequentially stacked, and
    the sealing film includes an inorganic layer and an organic layer.

2. The organic light-emitting display apparatus as claimed in claim 1, the polarizing film further comprising:
    a third adhesive layer disposed between the second moisture-blocking layer and the polarizing layer.

3. The organic light-emitting display apparatus as claimed in claim 1, wherein the support layer includes triacetate cellulose (TAC).

4. The organic light-emitting display apparatus as claimed in claim 1, wherein the polarizing layer includes polyvinyl alcohol (PVA).

5. The organic light-emitting display apparatus as claimed in claim 1, wherein the first moisture-blocking layer and the second moisture blocking layer includes a cyclo-olefin polymer (COP).

6. The organic light-emitting display apparatus as claimed in claim 1, wherein the first moisture-blocking layer and the second the moisture-blocking layer includes an organic material.

7. The organic light-emitting display apparatus as claimed in claim 1, wherein the sealing film includes a sandwich structure, in which the organic layer is inserted between two inorganic layers.

* * * * *